(12) United States Patent
Nagase

(10) Patent No.: US 10,797,036 B2
(45) Date of Patent: Oct. 6, 2020

(54) SEMICONDUCTOR DEVICE

(71) Applicant: DENSO CORPORATION, Kariya, Aichi-pref. (JP)

(72) Inventor: Takuo Nagase, Kariya (JP)

(73) Assignee: DENSO CORPORATION, Kariya (JP)

( * ) Notice: Subject to any disclaimer, the term of this patent is extended or adjusted under 35 U.S.C. 154(b) by 6 days.

(21) Appl. No.: 16/378,654

(22) Filed: Apr. 9, 2019

(65) Prior Publication Data

US 2019/0237453 A1 Aug. 1, 2019

Related U.S. Application Data

(63) Continuation of application No. PCT/JP2017/033183, filed on Sep. 14, 2017.

(30) Foreign Application Priority Data

Nov. 3, 2016 (JP) .................. 2016-215746

(51) Int. Cl.
| | |
|---|---|
| *H01L 25/18* | (2006.01) |
| *H02M 1/08* | (2006.01) |
| *H02M 7/00* | (2006.01) |
| *H02M 7/5395* | (2006.01) |

(Continued)

(52) U.S. Cl.
CPC .............. *H01L 25/18* (2013.01); *H01L 25/07* (2013.01); *H02M 1/08* (2013.01); *H02M 7/003* (2013.01); *H02M 7/5395* (2013.01); *H01L 2924/181* (2013.01); *H02M 7/5387* (2013.01)

(58) Field of Classification Search
CPC ... H01L 25/18; H01L 25/07; H01L 2924/181; H01L 23/49537; H01L 23/4334; H01L 23/49562; H01L 23/49575; H01L 23/49568; H01L 25/072; H02M 1/08;
(Continued)

(56) References Cited

U.S. PATENT DOCUMENTS

| | | |
|---|---|---|
| 2002/0024134 A1 | 2/2002 | Arai et al. |
| 2002/0024135 A1 | 2/2002 | Arai et al. |

(Continued)

FOREIGN PATENT DOCUMENTS

| | | |
|---|---|---|
| JP | H04-354156 A | 12/1992 |
| JP | 2005-175074 A | 6/2005 |
| JP | 2011-167010 A | 8/2011 |

*Primary Examiner* — Edward Chin
(74) *Attorney, Agent, or Firm* — Posz Law Group, PLC

(57) ABSTRACT

A semiconductor device includes a first semiconductor chip formed with an IGBT, a second semiconductor chip formed with a MOSFET, a first metal member electrically connected to a collector electrode and a drain electrode, and a second metal member electrically connected to an emitter electrode and a source electrode. The IGBT and the MOSFET connected in parallel to each other are turned on in the order of the IGBT and the MOSFET, and turned off in the order of the MOSFET and the IGBT. The second metal member has a main body portion on which the first and second semiconductor chips are mounted, and a joint portion as a terminal portion connected to the main body portion. In a plan view, a shortest distance between the joint portion and the first semiconductor chip is shorter than a shortest distance between the joint portion and the second semiconductor chip.

5 Claims, 8 Drawing Sheets

(51) Int. Cl.
*H01L 25/07* (2006.01)
*H02M 7/5387* (2007.01)

(58) Field of Classification Search
CPC ... H02M 7/003; H02M 7/5395; H02M 7/5387
See application file for complete search history.

(56) References Cited

U.S. PATENT DOCUMENTS

2007/0215903 A1* 9/2007 Sakamoto ......... H01L 23/49844
257/192
2014/0055173 A1 2/2014 Shiraishi et al.

* cited by examiner

US 10,797,036 B2

SEMICONDUCTOR DEVICE

CROSS REFERENCE TO RELATED APPLICATIONS

The present application is a continuation application of International Patent Application No. PCT/JP2017/033183 filed on Sep. 14, 2017, which designated the U.S. and claims the benefit of priority from Japanese Patent Application No. 2016-215746 filed on Nov. 3, 2016. The entire disclosures of all of the above applications are incorporated herein by reference.

TECHNICAL FIELD

The present disclosure relates to a semiconductor device including an IGBT and a MOSFET connected in parallel to the IGBT.

BACKGROUND

A semiconductor device, which will be used for a power module, may include an IGBT and a MOSFET connected in parallel to the IGBT. Such a semiconductor device is turned on in the order of the IGBT and the MOSFET, and turned off in the order of the MOSFET and the IGBT. Such a control reduces a current flowing through the MOSFET at the time of switching, and consequently reduces a temperature rise of the MOSFET.

SUMMARY

The present disclosure describes a semiconductor device including a first semiconductor chip formed with an IGBT, a second semiconductor chip formed with a MOSFET, a first metal member electrically connected to a collector electrode of the IGBT and a drain electrode of the MOSFET, a second metal member electrically connected to an emitter electrode of the IGBT and a source electrode of the MOSFET, in which the IGBT and the MOSFET are configured to be turned on in the order of the IGBT and the MOSFET, and turned off in the order of the MOSFET and the IGBT.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
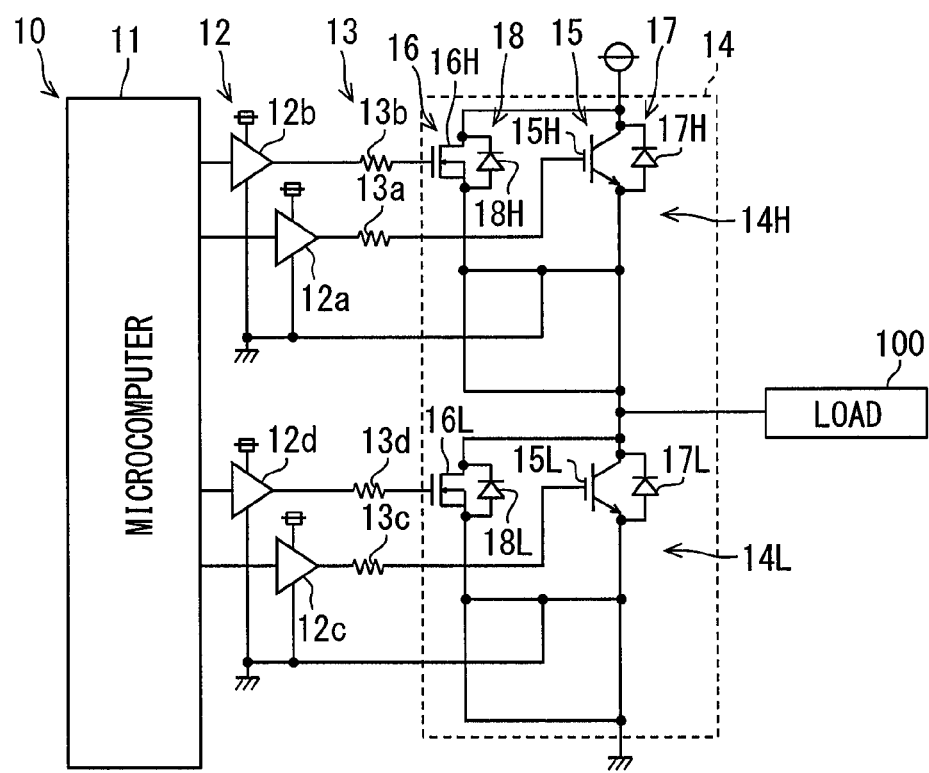
FIG. 1 is a diagram showing a power module having a semiconductor device according to a first embodiment.

For example, a first semiconductor chip on which the IGBT is formed and a second semiconductor chip on which the MOSFET is formed are disposed side by side between a pair of first metal member and second metal member. This arrangement can realize a parallel connection configuration of a semiconductor device. In such a semiconductor device, a collector electrode and a drain electrode, which are arranged to face the same direction in a plate thickness direction of the first and second semiconductor chips, may be electrically connected to the first metal member, and an emitter electrode and a source electrode, which are arranged to face the same direction in the plate thickness direction of the first and second semiconductor chips, may be electrically connected to the second metal member.

However, depending on the placement of the first semiconductor chip and the second semiconductor chip relative to the second metal member, an excessive voltage may be applied between the gate and the source of the MOSFET, which is in an off state, at the time of switching the IGBT.

According to an aspect of the present disclosure, a semiconductor device includes a first semiconductor chip, a second semiconductor chip, a first metal member, and a second metal member. The first semiconductor chip is formed with an IGBT. The first semiconductor chip has a collector electrode of the IGBT on a first surface and has an emitter electrode of the IGBT on a second surface opposite to the first surface in a first direction, which is a plate thickness direction. The second semiconductor chip is disposed side by side with the first semiconductor chip in a second direction perpendicular to the first direction. The second semiconductor chip is formed with a MOSFET. The second semiconductor chip has a drain electrode of the MOSFET on a first surface that is on the same side as the first surface of the first semiconductor chip in the first direction. The second semiconductor chip has a source electrode of the MOSFET on a second surface that is on the same side as the second surface of the first semiconductor chip in the first direction. The first metal member is disposed adjacent to the first surfaces of the first and second semiconductor chips and is electrically connected to both of the collector electrode and the drain electrode. The second metal member is disposed adjacent to the second surfaces of the first and second semiconductor devices and is electrically connected to both of the emitter electrode and the source electrode. The IGBT and the MOSFET are configured to be turned on in the order of the IGBT and the MOSFET, and turned off in the order of the MOSFET and the IGBT. The second metal member has a main body portion on which the first semiconductor chip and the second semiconductor chip are mounted, and a terminal portion that is connected to the main body portion and allows a current to flow into and out of the second metal member. In a plan view along the first direction, the shortest distance between the terminal portion and the first semiconductor chip is shorter than the shortest distance between the terminal portion and the second semiconductor chip.

In such a semiconductor device, since the IGBT is in an on state at the time of switching the MOSFET, an excessive current can be restricted from flowing through the MOSFET to increase the temperature of the semiconductor device.

The first semiconductor chip on which the IGBT is formed is disposed closer to the terminal portion than the second semiconductor chip on which the MOSFET is formed, in the plan view. Therefore, a parasitic inductance on an emitter side of the IGBT can be reduced. As such, an induced voltage generated at the time of switching the IGBT can be reduced, and an excessive voltage can be restricted from being applied between the gate and the source of the MOSFET which is in an off state.

Multiple embodiments will be described with reference to the drawings. In the multiple embodiments, functionally and/or structurally corresponding parts are denoted by the same reference numerals. In the following descriptions, a thickness direction of the semiconductor chip is indicated by a Z-direction, and an alignment direction of the semiconductor chips connected in parallel to each other is indicated by an X-direction, which is orthogonal to the Z-direction. A direction orthogonal to both of the Z-direction and the X-direction is denoted by a Y-direction. Unless otherwise specified, a shape along an XY-plane defined by the X-direction and the Y-direction, that is, a shape in a plan view viewed in the Z-direction, is defined as a planar shape. The Z-direction (plate thickness direction) corresponds to a first direction, the X-direction corresponds to a second direction, and the Y-direction corresponds to a third direction.

First Embodiment

First, a power module to which a semiconductor device is applied will be described with reference to FIG. 1.

A power module 10 shown in FIG. 1 includes a microcomputer 11, a driver 12, a gate resistor 13, and an upper and lower arm circuit 14. The microcomputer 11, the driver 12, and the gate resistor 13 configure a drive device of the upper and lower arm circuit 14. The upper and lower arm circuit 14 configures a power conversion device such as an inverter or a converter. The power module 10 according to the present embodiment is a drive device for a motor as a load 100, for example, a motor of an electric vehicle or a hybrid vehicle. The upper and lower arm circuit 14 configures one phase of a three-phase inverter.

The microcomputer 11 is a microcomputer including a CPU, a ROM, a RAM, a register, an I/O, and the like. In the microcomputer 11, a CPU executes a predetermined process in accordance with a control program stored in advance in a ROM, various types of information acquired through a bus, and the like, while utilizing a temporary storage function of a RAM or a register. In addition, the CPU outputs a signal obtained by the above process to a bus. In this manner, the microcomputer 11 executes various functions.

The microcomputer 11 generates a PWM signal based on an output current from the upper and lower arm circuit 14 to the load 100, and outputs the PWM signal to the driver 12. The microcomputer 11 controls on/off of an IGBT 15 and a MOSFET 16, which will be described later, through the driver 12. The microcomputer 11 can be replaced with an analog circuit or a digital circuit.

The driver 12 is a circuit for driving the IGBT 15 and the MOSFET 16. Based on the PWM signal, the driver 12 outputs a control signal to the respective gate electrodes of the IGBT 15 and the MOSFET 16. The control signal is supplied to the gate electrodes as a gate voltage through the gate resistor 13. Therefore, the microcomputer 11 and the driver 12 are control units of the upper and lower arm circuit 14. The power module 10 includes, as the driver 12 and the gate resistor 13, drivers 12a, 12b and gate resistors 13a, 13b for an upper arm circuit 14H, and drivers 12c, 12d and gate resistors 13c, 13d for a lower arm circuit 14L.

The driver 12a outputs a control signal to a gate electrode of an IGBT 15H through the gate resistor 13a. The driver 12b outputs the control signal to a gate electrode of a MOSFET 16H through the gate resistor 13b. The driver 12c outputs the control signal to a gate electrode of an IGBT 15L through the gate resistor 13c. The driver 12d outputs the control signal to a gate electrode of an MOSFET 16L through the gate resistor 13d.

The upper and lower arm circuit 14 has the upper arm circuit 14H and the lower arm circuit 14L. The upper arm circuit 14H and the lower arm circuit 14L are connected in series with each other with the upper arm circuit 14H on a high potential side and the lower arm circuit 14L on the low potential side. The upper arm circuit 14H is connected to a power supply line on a positive electrode side of a DC power supply, and the lower arm circuit 14L is connected to a power supply line on a negative electrode side of the DC power supply. Hereinafter, the power supply line on the positive electrode side is referred to as a high potential power supply line, and the power supply line on the negative electrode side is referred to as a low potential power supply line. The upper arm circuit 14H and the lower arm circuit 14L each have the IGBT 15 and the MOSFET 16. The upper arm circuit 14H and the lower arm circuit 14L each have diodes 17 and 18.

As the IGBT 15, the upper and lower arm circuit 14 has the IGBT 15H on the upper arm circuit 14H side and the IGBT 15L on the lower arm circuit 14L side. As the MOSFET 16, the upper and lower arm circuit 14 has the MOSFET 16H on the upper arm circuit 14H side and the MOSFET 16L on the lower arm circuit 14L side. The upper and lower arm circuit 14 has diodes 17H and 18H on the upper arm circuit 14H side and diodes 17L and 18L on the lower arm circuit 14L side as the diodes 17 and 18.

In the upper arm circuit 14H, the IGBT 15H and the MOSFET 16H are connected in parallel with each other. A collector electrode of the IGBT 15H and a drain electrode of the MOSFET 16H are electrically connected to each other. An emitter electrode of the IGBT 15H and a source electrode of the MOSFET 16H are electrically connected to each other. In the present embodiment, an n-channel type is adopted as the IGBT 15H and the MOSFET 16H. A collector electrode and a drain electrode are electrically connected to the high potential power supply line, and an emitter electrode and a source electrode are electrically connected to an output line to the load 100.

The diode 17H are connected in anti-parallel to the IGBT 15H for return flow. An anode of the diode 17H is connected to the emitter electrode, and a cathode of the diode 17H is connected to the collector electrode. Likewise, the diode 18H is connected in anti-parallel to the MOSFET 16H for return flow. An anode of the diode 18H is connected to the source electrode, and a cathode of the diode 18H is connected to the drain electrode.

A connection point between the emitter electrode of the IGBT 15H and the source electrode of the MOSFET 16H is connected to the ground through a common wiring. The drivers 12a and 12b generate the control signals based on a potential of the connection point, and output the control signals to the respective gate electrodes. The driver 12a and the gate resistor 13a correspond to the IGBT 15H, and the driver 12b and the gate resistor 13b correspond to the MOSFET 16H.

The lower arm circuit 14L has the same configuration as that of the upper arm circuit 14H. In the lower arm circuit 14L, the IGBT 15L and the MOSFET 16L are connected in parallel with each other. The collector electrode of the IGBT 15L and the drain electrode of the MOSFET 16L are electrically connected to each other. An emitter electrode of the IGBT 15L and a source electrode of the MOSFET 16L are electrically connected to each other. In the present embodiment, an n-channel type is adopted as the IGBT 15L and the MOSFET 16L. A collector electrode and a drain electrode are electrically connected to the output line to the load 100, and an emitter electrode and a source electrode are electrically connected to the low potential power supply line.

The diode 17L is connected in anti-parallel to the IGBT 15L for a return flow. An anode of the diode 17L is connected to the emitter electrode, and a cathode of the diode 17L is connected to the collector electrode. Likewise, the diode 18L is connected in anti-parallel to the MOSFET 16L for the return flow. An anode of the diode 18L is connected to the source electrode, and a cathode of the diode 18L is connected to the drain electrode.

A connection point between the emitter electrode of the IGBT 15L and the source electrode of the MOSFET 16L is connected to the ground through a common wiring. The drivers 12c and 12d generate the control signals based on the potential of the connection point, and output the control signal to the respective gate electrodes. The driver 12c and the gate resistor 13c correspond to the IGBT 15L, and the driver 12d and the gate resistor 13d correspond to the MOSFET 16L.

Next, a semiconductor device will be described with reference to FIGS. 2 to 6.

Figure 2:
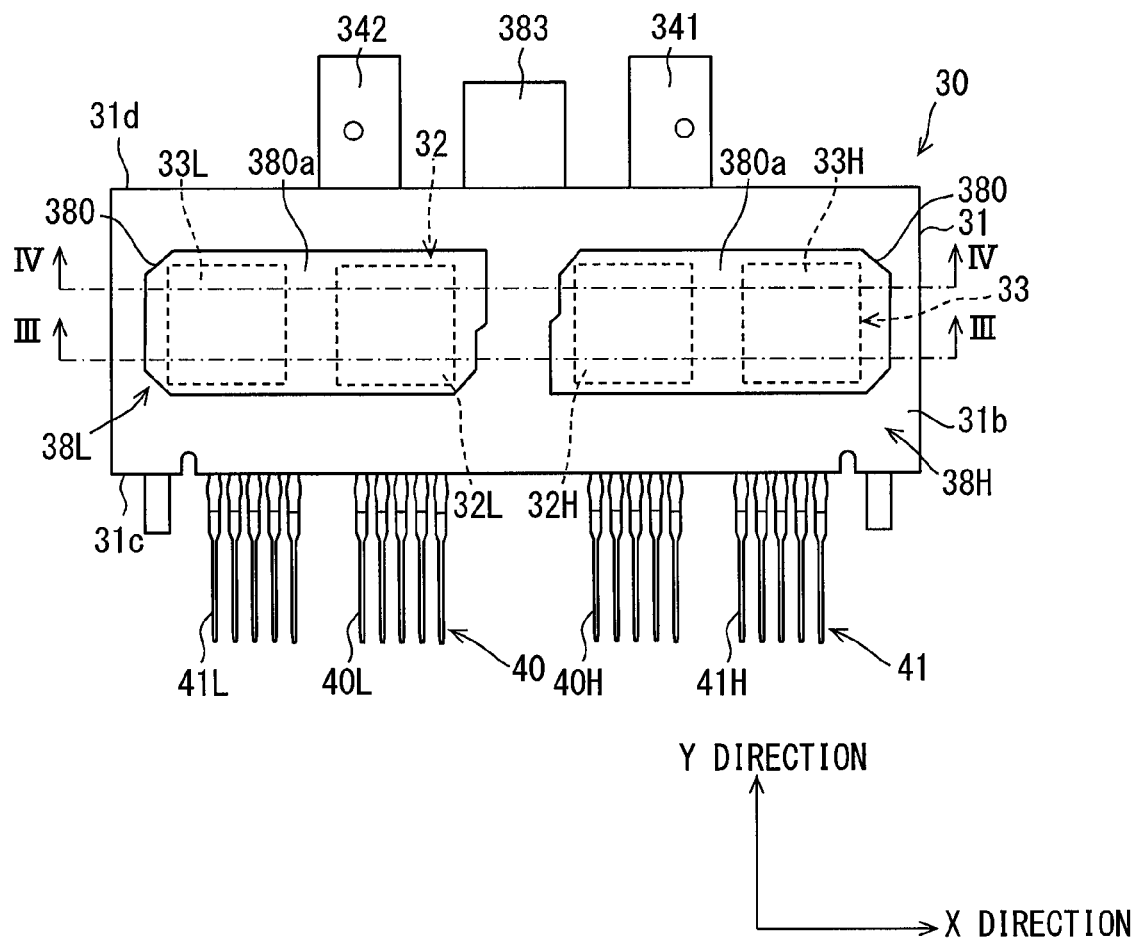
FIG. 2 is a diagram showing a plan view of the semiconductor device according to the first embodiment.
Figure 3:
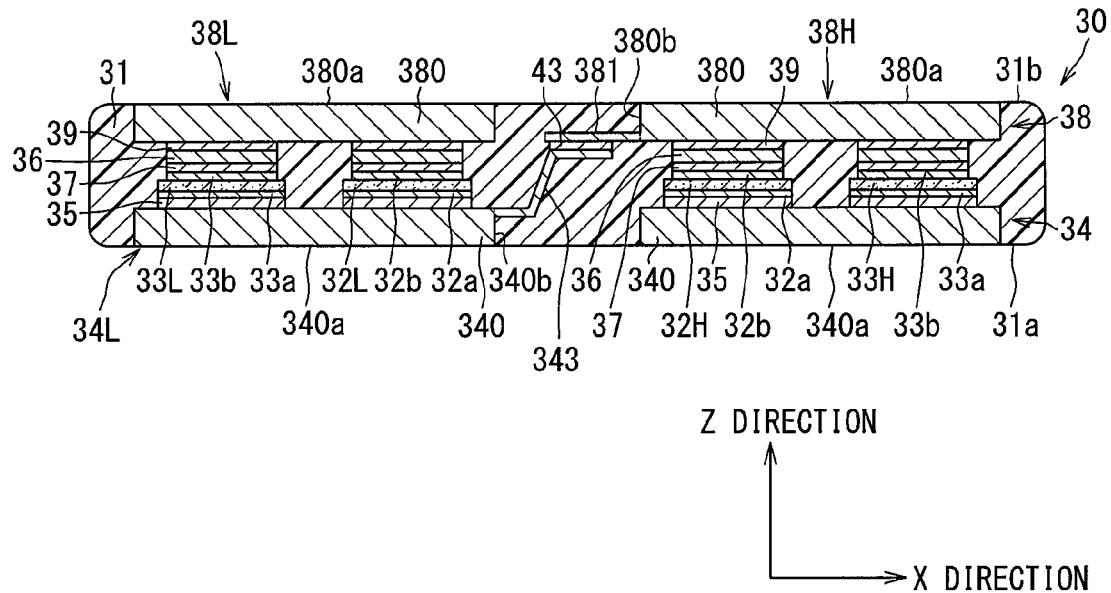
FIG. 3 is a diagram showing a cross-sectional view taken along a line III-III of FIG. 2.
Figure 4:
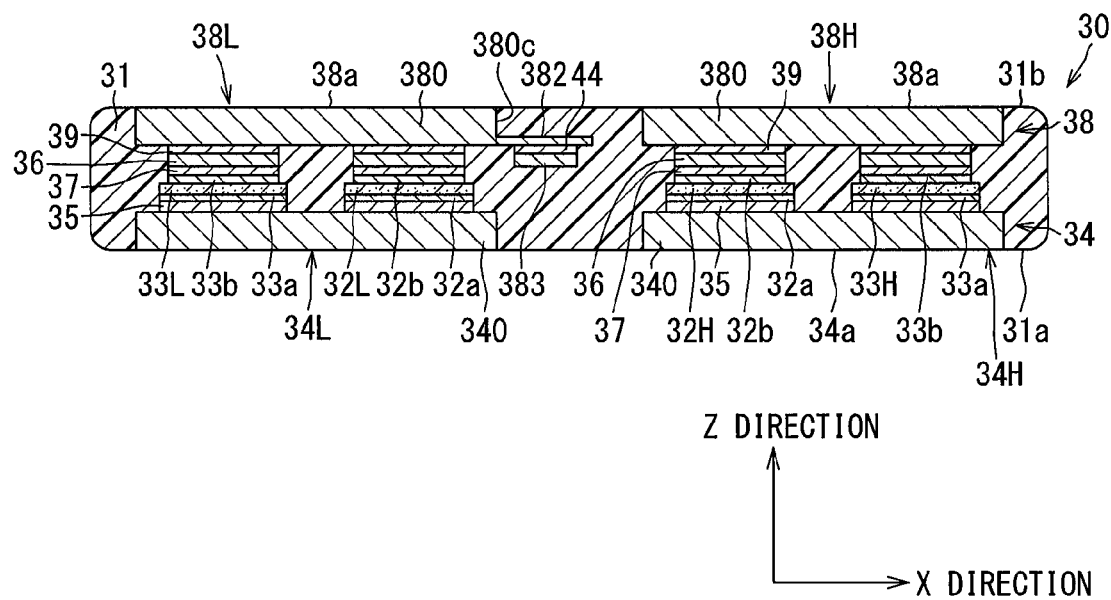
FIG. 4 is a diagram showing a cross-sectional view taken along a line IV-IV of FIG. 2.

The semiconductor device 30 shown in FIGS. 2 to 4 configures the upper and lower arm circuit 14 described above. The semiconductor device 30 includes a sealing resin body 31, semiconductor chips 32 and 33, a first metal member 34, terminals 36, a second metal member 38, and signal terminals 40 and 41. Hereinafter, H at an end of the symbol indicates an element that belongs to the upper arm circuit 14H, and L at an end indicates an element that belongs to the lower arm circuit 14L. In order to clarify the upper arm circuit 14H and the lower arm circuit 14L, H and L are given to the tails of some of the elements, and the upper arm circuit 14H and the lower arm circuit 14L have a common symbol for another part.

The sealing resin body 31 is made of, for example, an epoxy resin. The sealing resin body 31 is molded by, for example, a transfer molding method. The sealing resin body 31 has one surface 31a substantially orthogonal to the Z-direction, a back surface 31b opposite to the one surface 31a, and a side surface connecting the one surface 31a and the back surface 31b. The one surface 31a and the back surface 31b are flat surfaces, for example.

The semiconductor chips 32 are each provided by forming the IGBT 15 on a semiconductor substrate made of silicon (Si), silicon carbide (SiC), gallium nitride (GaN), or the like. In the present embodiment, the n-channel type IGBT 15 and the diode 17 connected in anti-parallel with the IGBT 15 are formed on the semiconductor substrate made of silicon. In other words, an RC (Reverse Conducting)-IGBT is formed on each of the semiconductor chips 32. The semiconductor chips 32 each have substantially a rectangular shape as a planar shape.

The semiconductor device 30 includes, as the semiconductor chips 32, a semiconductor chip 32H on which the IGBT 15H and the diode 17H are formed, and a semiconductor chip 32L on which the IGBT 15L and the diode 17L are formed. The semiconductor chip 32H forms the upper arm circuit 14H, and the semiconductor chip 32L forms the lower arm circuit 14L. The semiconductor chips 32 correspond to a first semiconductor chip. The semiconductor chip 32H corresponds to a first semiconductor chip of the upper arm circuit, and the semiconductor chip 32L corresponds to a first semiconductor chip of the lower arm circuit. The semiconductor chip 32H will also be referred to as an upper arm first semiconductor chip, and the semiconductor chip 32L will also be referred to as a lower arm first semiconductor chip.

The IGBT 15 and the diode 17 have a vertical structure so that a current flows in the Z-direction. In the plate thickness direction of the semiconductor chips 32, that is, in the Z-direction, a collector electrode 32a is formed on one surface of each semiconductor chip 32, and an emitter electrode 32b is formed on the back surface opposite to the one surface. The collector electrode 32a also serves as a cathode electrode of the diode 17, and the emitter electrode 32b also serves as an anode electrode of the diode 17. For example, the one surface of the semiconductor chip 32 will also be referred to as a first surface, and the back surface of the semiconductor chip 32 will also be referred to as a second surface opposite to the first surface in the Z-direction.

The semiconductor chips 33 are each provided by forming a MOSFET 16 on semiconductor substrates made of silicon, silicon carbide, gallium nitride, or the like. In the present embodiment, an n-channel MOSFET 16 and a diode 18 connected in anti-parallel to the MOSFET 16 are formed on a semiconductor substrate made of silicon carbide. The semiconductor chips 33 each have substantially a rectangular shape as a planar shape.

The semiconductor device 30 includes, as the semiconductor chips 33, a semiconductor chip 33H on which the MOSFET 16H and the diode 18H are formed, and a semiconductor chip 33L on which the MOSFET 16L and the diode 18L are formed. The semiconductor chip 33H forms the upper arm circuit 14H, and the semiconductor chip 33L forms the lower arm circuit 14L. The semiconductor chip 33 corresponds to the second semiconductor chip. The semiconductor chip 33H corresponds to the second semiconductor chip of the upper arm circuit, and the semiconductor chip 33L corresponds to the second semiconductor chip of the lower arm circuit. The semiconductor chip 33H will also be referred to as an upper arm second semiconductor chip, and the semiconductor chip 33L will also be referred to as a lower arm second semiconductor chip.

The MOSFET 16 and the diode 18 have a vertical structure so that a current flows in the Z-direction. In the plate thickness direction of the semiconductor chips 33, that is, in the Z-direction, a drain electrode 33a is formed on one surface of each semiconductor chip 33, and a source electrode 33b is formed on the back surface opposite to the one surface. The drain electrode 33a also serves as a cathode electrode of the diode 18, and the source electrode 33b also serves as an anode electrode of the diode 18.

The semiconductor chips 32 and 33 are disposed side by side in the X-direction. More specifically, the semiconductor chips 32H and 33H of the upper arm circuit 14H are located at substantially the same height in the Z-direction, and are disposed side by side in the X-direction. The semiconductor chips 32L and 33L of the lower arm circuit 14L are also positioned at substantially the same height in the Z-direction, and are disposed side by side in the X-direction. In the Z-direction, the collector electrode 32a and the drain electrode 33a are formed on the same surface side, and the emitter electrode 32b and the source electrode 33b are formed on the same surface side. The semiconductor chips 33L, 32H, 32H, and 33L are disposed in one row along the X-direction in the stated order. In other words, one surface of the semiconductor chip 32 and one surface of the semiconductor chip 33 are surfaces on the same side, and the back surface of the semiconductor chip 32 and the back surface of the semiconductor chip 33 are surfaces on the same side.

Pads 32c, which are signal electrodes, are formed on the back surface of the semiconductor chip 32, that is, an emitter electrode formation surface. The pads 32c are formed at positions different from a position of the emitter electrode 32b. The pads 32c are electrically isolated from the emitter electrode 32b. The pads 32c are formed at an end portion opposite to the formation region of the emitter electrode 32b in the Y-direction.

In the present embodiment, each semiconductor chip 32 has five pads 32c. Specifically, the five pads 32c are provided for a gate electrode, a Kelvin emitter for detecting a potential of the emitter electrode 32b, a current sense, an anode potential of a temperature sensor (temperature-sensitive diode) for detecting a temperature of the semiconductor chip 32, and a cathode potential. The five pads 32c are collectively formed adjacent to one end in the Y-direction in the semiconductor chip 32 having a substantially rectangular planar shape, and are formed side by side in the X-direction.

Similarly, pads 33c are also formed on the back surface of the semiconductor chip 33, that is, a source electrode formation surface. The pads 33c are formed at positions different from a position of the source electrode 33b. The pads 33c are electrically isolated from the source electrode 33b. The pad 33c is formed at an end portion opposite to a formation region of the source electrode 33b in the Y-direction.

In the present embodiment, each semiconductor chip 33 has the five pads 33c. Specifically, the five pads 33c are provided for a gate electrode, a Kelvin source for detecting the potential of the source electrode 33b, a current sense, an anode potential of a temperature sensor (temperature-sensitive diode) for detecting the temperature of the semiconductor chip 33, and a cathode potential. The five pads 33c are collectively formed on one end side in the Y-direction in the semiconductor chip 33 having a substantially rectangular planar shape, and are formed side by side in the X-direction.

The first metal member 34 is disposed adjacent to the one surface of the semiconductor chips 32 and 33, and is connected to the collector electrode 32a of the semiconductor chip 32 and the drain electrode 33a of the semiconductor chip 33 through solders 35. The first metal member 34 functions as a wiring. The first metal member 34 also functions to radiate a heat of the semiconductor chips 32 and 33 to the outside of the semiconductor device 30. For that reason, the first metal member 34 is also referred to as a heat sink and a heat radiation member. The first metal member 34 is made of at least a metal material to ensure an electrical conductivity and a thermal conductivity.

More specifically, the first metal member 34 has main body portions 340. The semiconductor chips 32 and 33 are mounted on the main body portions 340. The main body portions 340 are also referred to as base portions. The main body portions 340 are provided so as to include the corresponding semiconductor chips 32 and 33 in a plan view in the Z-direction.

Most of the main body portions 340 are covered with a sealing resin body 31. A heat radiation surface 340a of a surface of each main body portion 340, which is opposite to the semiconductor chips 32 and 33, is exposed from the sealing resin body 31. The heat radiation surface 340a is substantially coplanar with one surface 31a. A portion of the surface of the main body portion 340 excluding a connection portion with the solder 35 and the heat radiation surface 340a is covered with the sealing resin body 31.

In the present embodiment, the semiconductor device 30 includes, as the first metal member 34, a first metal member 34H of the upper arm circuit 14H and a first metal member 34L of the lower arm circuit 14L. The first metal member 34H will also be referred to as an upper arm first metal member, and the first metal member 34L will also be referred to as a lower arm first metal member. The collector electrode 32a of the semiconductor chip 32H and the drain electrode 33a of the semiconductor chip 33H are connected to a surface of the first metal member 34 H opposite to the heat radiation surface 340a of the main body portion 340 through the solder 35. The collector electrode 32a of the semiconductor chip 32L and the drain electrode 33a of the semiconductor chip 33L are connected to a surface of the first metal member 34L opposite to the heat radiation surface 340a of the main body portion 340 through the solder 35. The main body portions 340 of the first metal members 34H and 34L are disposed side by side in the X-direction, and are disposed at substantially the same positions in the Z-direction. The heat radiation surfaces 340a of the first metal members 34H and 34L are exposed from the one surface 31a of the sealing resin body 31 and are aligned in the X-direction with each other.

The respective terminals 36 are interposed between the semiconductor chips 32 and 33 and the second metal members 38 (the main body portion 380). The terminals 36 are made of at least a metal material to ensure an electrical conductivity and a thermal conductivity because the terminals 36 are located on an electrical conduction path and a thermal conduction path between semiconductor chips 32, 33 and the second metal members 38. The terminals 36 corresponding to the semiconductor chips 32 (32H, 32L) are disposed to face the emitter electrodes 32b, and are electrically connected to the emitter electrodes 32b through the solders 37. The terminals 36 corresponding to the semiconductor chips 33 (33H, 33L) are disposed to face the source electrodes 33b, and are electrically connected to the source electrodes 33b through the solders 37.

The second metal members 38 are disposed adjacent to the back surface of the semiconductor chips 32 and 33, and are electrically connected to the emitter electrode 32b of the semiconductor chip 32 and the drain electrode 33a of the semiconductor chip 33 through the solders 39, the terminals 36, and the solders 37, respectively. Like the first metal members 34, the second metal members 38 also function as a wiring and function to radiate a heat of the corresponding semiconductor chips 32 and 33 to the outside of the semiconductor device 30. The second metal members 38 are also referred to as a heat sink and a heat radiation member. The second metal members 38 are made of at least a metal material to ensure an electrical conductivity and a thermal conductivity.

More specifically, the second metal members 38 also each have the main body portion 380. The semiconductor chips 32 and 33 are mounted on the main body portions 380. The main body portion 380 is also referred to as a base portion. The main body portions 380 are provided so as to include the corresponding semiconductor chips 32 and 33 in the plan view in the Z-direction.

Most of the main body portion 380 is covered with the sealing resin body 31. The heat radiation surface 380a of the surface of the main body portion 380 opposite to the semiconductor chips 32 and 33 is exposed from the sealing resin body 31. The heat radiation surface 380a is substantially coplanar with the back surface 31b. A portion of the surface of the main body portion 380 excluding the connection portion with the solder 39 and the heat radiation surface 380a is covered with the sealing resin body 31.

In the present embodiment, the semiconductor device 30 includes, as the second metal member 38, the second metal member 38H of the upper arm circuit 14H and the second metal member 38L of the lower arm circuit 14L. The second metal member 38H will also be referred to as an upper arm second metal member, and the second metal member 38L will also be referred to as a lower arm second metal member. The terminals 36 corresponding to the semiconductor chips 32H and 33H are connected to the surface of the second metal member 38H opposite to the heat radiation surface 380a of the main body portion 380 through solder 39. The terminals 36 corresponding to the semiconductor chips 32L and 33L are connected to the surface of the second metal member 38L opposite to the heat radiation surface 380a of the main body portion 380 through the solder 39. The second metal members 38H and 38L are disposed side by side in the X-direction, and are disposed at substantially the same positions in the Z-direction. The heat radiation surfaces 380a of the second metal members 38H and 38L are exposed from the back surface 31b of the sealing resin body 31, and are aligned with each other in the X-direction.

In this manner, the semiconductor chips 32H and 33H are disposed between the main body portion 340 of the first metal member 34H and the main body portion 380 of the second metal member 38H. The semiconductor chips 32L and 33L are disposed between the main body portion 340 of the first metal member 34L and the main body portion 380 of the second metal member 38L.

The signal terminals 40 are connected to the pads 32c of the respective semiconductor chips 32 through bonding wires 42. The signal terminals 41 are connected to the pads 33c of the respective semiconductor chips 33 through bonding wires 42. In the present embodiment, the bonding wires 42 made of an aluminum-based material are employed. The signal terminals 40 and 41 are extended in the Y-direction and protrude to the outside from a side surface 31c of the sealing resin body 31.

The semiconductor device 30 has a signal terminal 40H of the upper arm circuit 14H and a signal terminal 40L of the lower arm circuit 14L, as the signal terminals 40. The signal terminal 40H is connected to the pad of the semiconductor chip 32H, and the signal terminal 40L is connected to the pad of the semiconductor chip 32L. The semiconductor device 30 has a signal terminal 41H of the upper arm circuit 14H and a signal terminal 41L of the lower arm circuit 14L, as the signal terminals 41. The signal terminal 41H is connected to a pad of the semiconductor chip 33H, and the signal terminal 41L is connected to a pad of the semiconductor chip 33L.

Figure 5:
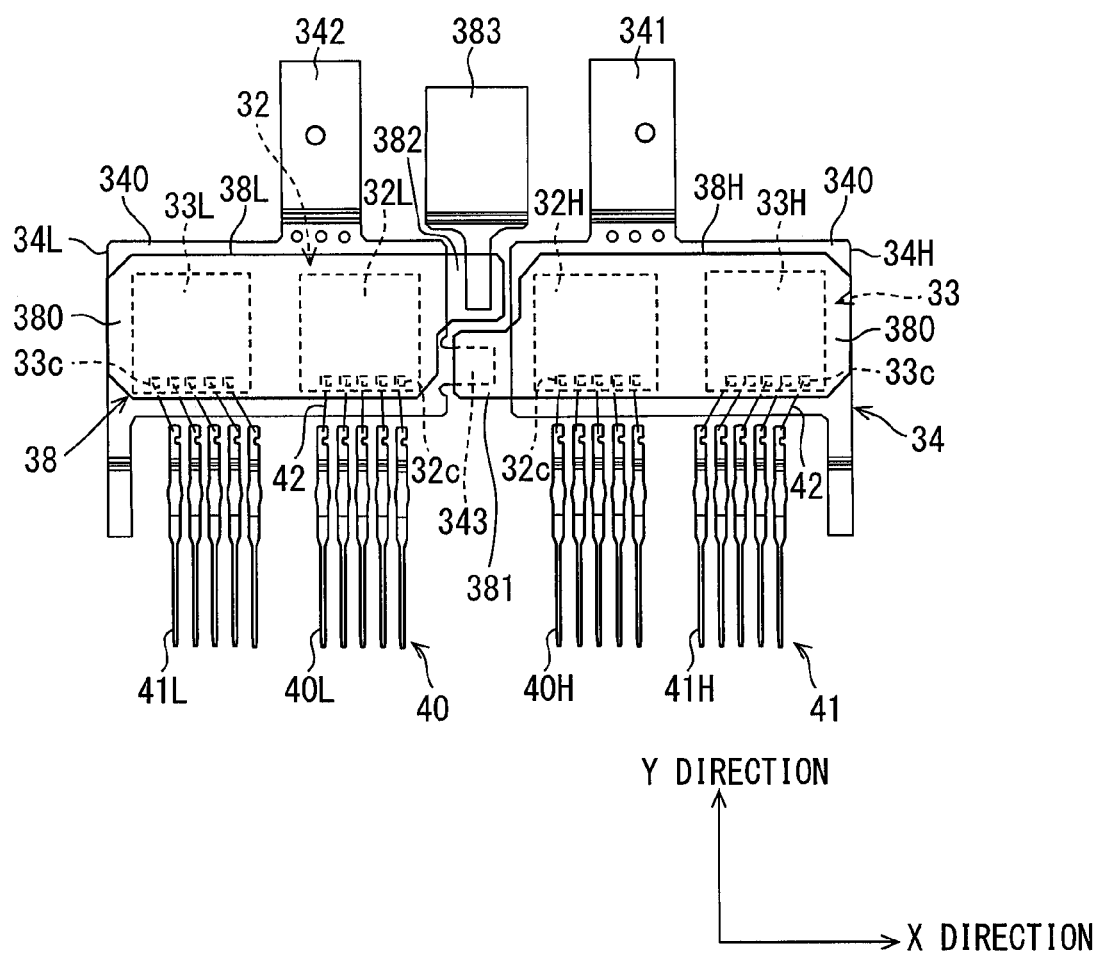
FIG. 5 is a diagram showing a plan view of the semiconductor device shown in FIG. 2 from which a sealing resin body is omitted.

Next, portions of the first metal member 34 and the second metal member 38 which are connected to the main body portions 340 and 380 will be described. The continuous portions are portions for electrically connecting the corresponding main body portions 340 and 380 to the outside. As shown in FIG. 5, the first metal member 34H further includes a main terminal 341. The first metal member 34L further includes a main terminal 342 and a joint portion 343. The second metal member 38H further includes a joint portion 381. The second metal member 38L further includes a joint portion 382. The joint portions 381 and 382 correspond to terminal portions for allowing a current to flow into and out of the second metal member 38, (the main body portion 380). The terminal portion forms a part of the current path. The terminal portion is an input/output terminal for inputting and outputting an electric power. The joint portion 381 corresponds to a first joint portion, and the joint portion 382 corresponds to a second joint portion.

The main terminal 341 is connected to the main body portion 340 of the first metal member 34H. The main terminal 341 is an external connection terminal for connecting the semiconductor device 30 to a high potential power supply line. The main terminal 341 is also referred to as a high potential power supply terminal and a P terminal. The main terminal 341 extends in the Y-direction from the main body portion 340 of the first metal member 34H. In the present embodiment, the main terminal 341 and the main body portion 340 are integrally provided by processing the same metal plate. The main terminal 341 is connected to one end of the main body portion 340 in the Y-direction. More specifically, the main terminal 341 is connected to the opposite end portion of the signal terminals 40 and 41. The main terminal 341 may be a member separate from the corresponding main body portion 340 and connected to the main body portion 340 to employ a configuration connected to the main body portion 340. The main terminal 341 protrudes to the outside from the side surface 31d opposite to the side surface 31c from which the signal terminals 40 and 41 protrude.

The main terminal 342 is connected to the main body portion 340 of the first metal member 34L. The main terminal 342 is an external connection terminal for connecting the semiconductor device 30 to an output line to the load 100. The main terminal 342 is also referred to as an output terminal and an O terminal. The main terminal 342 extends from the main body portion 340 of the first metal member 34L in the Y-direction on the same side as the main terminal 341. In the present embodiment, the main terminal 342 and the main body portion 340 are integrally provided by processing the same metal plate. The main terminal 342 is connected to one end of the main body portion 340 in the Y-direction. The main terminal 342 may also be a member separate from the corresponding main body portion 340, and may be connected to the main body portion 340 so as to be connected to the main body portion 340. The main terminal 342 protrudes to the outside from the same side surface 31d as the main terminal 341.

The joint portion 343 is connected to the same main body portion 340 as the main terminal 342, that is, the main body portion 340 of the first metal member 34L. The joint portion 343 is integrally provided with the main body portion 340 by processing the same metal plate. The joint portion 343 is provided to be thinner than the main body portion 340 so as to be covered with the sealing resin body 31. The joint portion 343 is connected to be substantially coplanar with the surface of the main body portion 340 on the side of the semiconductor chips 32L and 33L. The joint portion 343 extends from the side surface 340b of the main body portion 340 toward the second metal member 38H. The joint portion 343 extends in the X-direction in a plan view from the Z-direction. In the present embodiment, as shown in FIG. 3, the joint portion 343 has two bent portions.

The joint portion 381 is connected to the main body portion 380 of the second metal member 38H. The joint portion 381 is integrally provided with the main body portion 380 by processing the same metal plate. The joint portion 381 is provided to be thinner than the main body portion 380 so as to be covered with the sealing resin body 31. The joint portion 381 is connected to be substantially coplanar with the surface of the main body portion 380 on the side of the semiconductor chips 32H and 33H. The joint portion 381 has a thin plate-shape and extends in the X-direction from the side surface 380b of the main body portion 380.

Tip portions of the joint portions 343 and 381 overlap with each other in a projection view in the Z-direction. The joint portions 343 and 381 are connected to each other through a solder 43. The upper arm circuit 14H and the lower arm circuit 14L are electrically connected to each other by the joint portions 343 and 381. The joint portions 343 and 381 electrically relay the main body portion 380 of the second metal member 38H disposed adjacent to the back surface of the semiconductor chips 32H and 33H and the main body portion 340 of the first metal member 34L disposed adjacent to the one surface of the semiconductor chips 32L and 33L.

Figure 6:
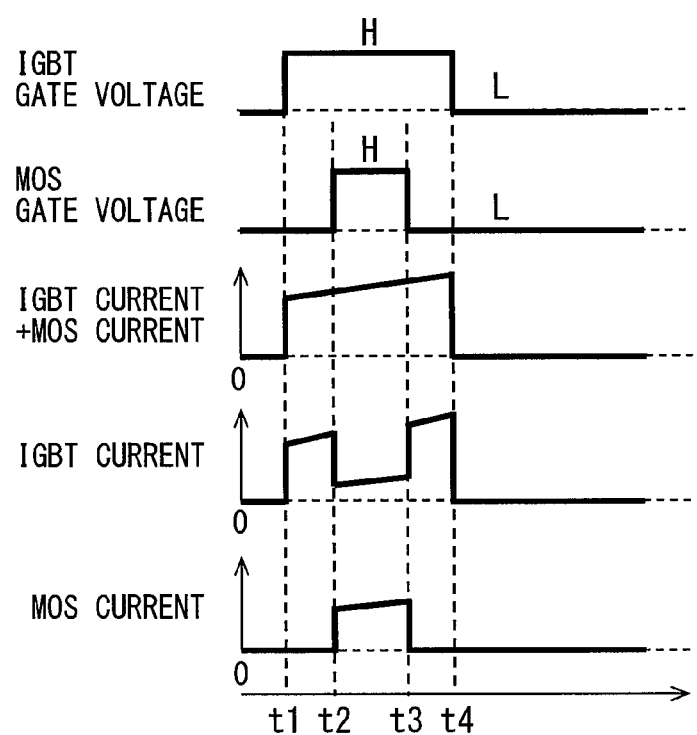
FIG. 6 is a timing chart showing the operation of an IGBT and a MOSFET.

The joint portion 382 is connected to the main body portion 380 of the second metal member 38L. The joint portion 382 electrically relays the main body portion 380 and a main terminal 383 to be described later. The joint portion 382 is integrally provided with the main body portion 380 by processing the same metal plate. The joint portion 382 is provided to be thinner than the main body portion 380 so as to be covered with the sealing resin body 31. The joint portion 382 is connected to be substantially coplanar with the surface of the main body portion 380 on the side of the semiconductor chips 32L and 33L. The joint portion 382 has a thin plate-shape and extends in the X-direction from the side surface 380c of the main body portion 380 as shown in FIG. 4. In addition, as shown in FIGS. 5 and 6, the joint portion 382 is aligned with the joint portion 381 side by side in the Y-direction.

In the present embodiment, the second metal members 38H and 38L have a common shape, that is, have a common component. A positional relationship between the main body portion 380 and the joint portions 381 and 382 serving as terminal portions is also the same.

The semiconductor device 30 further includes the main terminal 383. The main terminal 383 is an external connection terminal for connecting the semiconductor device 30 to the low potential power supply line. The main terminal 383 is also referred to as a low potential power supply terminal and an N terminal. The main terminal 383 is disposed so that a part of the main terminal 383 overlaps with the joint portion 382 in a projection view from the Z-direction. As shown in FIG. 4, the main terminal 383 is disposed adjacent to the one surface 31a of the joint portion 382. The main terminal 383 and the joint portion 382 are connected to each other through a solder 44.

The main terminal 383 extends in the Y-direction and protrudes to the outside from the same side surface 31d as the main terminals 341 and 342. Protrusion portions of the main terminals 341, 342, and 383 from the sealing resin body 31 are disposed at substantially the same positions in the Z-direction. In the X-direction, the main terminal 341 (P terminal), the main terminal 383 (N terminal), and the main terminal 342 (O terminal) are disposed in the stated order. In other words, the main terminal 383 connected to the low potential power supply line is disposed adjacent to the main terminal 341 connected to a high potential power supply line.

In the semiconductor device 30 configured as described above, a part of each of the semiconductor chips 32 and 33, the first metal member 34, a part of each of the terminal 36 and the second metal member 38, a part of each of the signal terminals 40 and 41, and a part of the main terminal 383 are integrally sealed by the sealing resin body 31. In the semiconductor device 30, the semiconductor chips 32 and 33 configuring the upper and lower arm circuits 14 for one phase are sealed by the sealing resin body 31. For that reason, the semiconductor device 30 is also referred to as a 2 in 1 package.

The first metal member 34 and the second metal member 38 are cut together with the sealing resin body 31. Therefore, the one surface 31a and the heat radiation surface 340a are cutting surfaces. The heat radiation surfaces 340a of the main body portions 340 of the first metal members 34H and 34L are located in the same plane, and are substantially coplanar with the one surface 31a of the sealing resin body 31. Similarly, the back surface 31b and the heat radiation surface 380a serve as cutting surfaces. The heat radiation surfaces 380a of the main body portions 380 of the second metal members 38H and 38L are located in the same plane, and are substantially coplanar with the back surface 31b of the sealing resin body 31. In this manner, the semiconductor device 30 has a double-sided heat radiation structure in which the heat radiation surfaces 340a and 380a are both exposed from the sealing resin body 31.

Next, the effects of the power module 10 and the semiconductor device 30 will be described with reference to FIGS. 6 to 9. In the following, the upper arm circuit 14H of the upper and lower arm circuits 14 will be exemplified.

First, the operation of the IGBT 15H and the MOSFET 16H configuring the upper arm circuit 14H will be described with reference to FIG. 6. FIG. 6 shows a gate voltage applied to the IGBT 15H, a gate voltage applied to the MOSFET 16H, a total of the currents flowing through the IGBT 15H and the MOSFET 16H, a current flowing through the IGBT 15H, and a current flowing through the MOSFET 16H in a stated order from a top.

In the present embodiment, the drive device including the microcomputer 11 and the drivers 12a, 12b controls the drive of the IGBT 15H and the MOSFET 16H so that the IGBT 15H and MOSFET 16H are turned on in the order of the IGBT 15H and the MOSFET 16H, and turned off in the order of the MOSFET 16H and the IGBT 15H. As a result, the IGBT 15H is turned on at a time t1, and the MOSFET 16H is turned on at a time t2 when a predetermined time has elapsed since the IGBT 15H has been turned on. At the time t2, most of the current flows in the MOSFET 16H having a lower on-resistance in a small current region. Therefore, it is possible to reduce a loss of the inverter. When an excessive current occurs, the current flows in the IGBT 15H having a larger on-resistance in a large current range, thereby being capable of reducing an increase in the temperature of the MOSFET 16H.

At a time t3, the MOSFET 16H is turned off, and then at a time t4, the IGBT 15H is turned off. Since the MOSFET 16H is turned off first in this manner, all the current flows through the IGBT 15H after the turn-off, and does not flow through the MOSFET 16H. Therefore, it is possible to reduce an increase in the temperature of the MOSFET 16H. Since the IGBT 15L and the MOSFET 16L configuring the lower arm circuit 14L are also controlled in the same manner, an increase in the temperature of the MOSFET 16L can be reduced.

Figure 7:
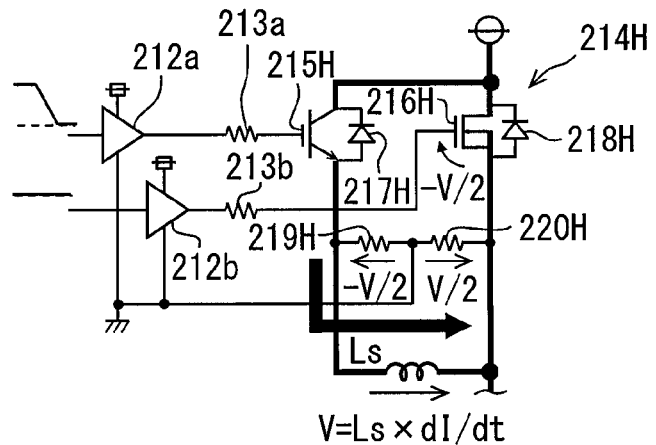
FIG. 7 is a diagram showing an equivalent circuit of an upper arm circuit in a layout of a reference example.

In a reference example shown in FIG. 7, 200 is added to reference numerals of elements involved in the present embodiment. Reference numeral 219H denotes a resistance of a wiring connecting the emitter electrode of the IGBT 215H and the common wiring described above. Reference numeral 220H denotes a resistance of a wiring connecting the source electrode of the MOSFET 216H and the common wiring described above. A connection point of the resistors 219H and 220H is connected to the ground through a common wiring.

In the reference embodiment, two semiconductor chips are placed on the second metal member so that, in a plan view in the Z-direction, the shortest distance between the semiconductor chip on which the IGBT 215H is formed and the joint portion (terminal portion) of the second metal member is longer than the shortest distance between the semiconductor chip on which the MOSFET 216H is formed and the joint portion.

With the above placement, since a parasitic inductance on the source side of the MOSFET 216H is sufficiently smaller than a parasitic inductance on the emitter side of the IGBT 215H, the parasitic inductance on the source side is omitted and a parasitic inductance Ls on the emitter side is shown in FIG. 7 for convenience. When the IGBT 215H is turned off, an induced voltage V=Ls×(dI/dt) is generated due to an influence of the parasitic inductance Ls. That is, a voltage V is developed between the emitter electrode and the source electrode. dI/dt is a temporal change rate of the current with turn-off of the IGBT 215H.

In this example, it is assumed that the resistance values of the resistors 219H and 220H are equal to each other. The potential of the source electrode becomes −V/2 by the induced voltage V, and a voltage of −V/2 is generated between the gate and the source of the MOSFET 216H. Since the induced voltage V reaches several tens of volts, an excessive voltage is applied to the gate withstand voltage (for example, 20 V).

Figure 8:
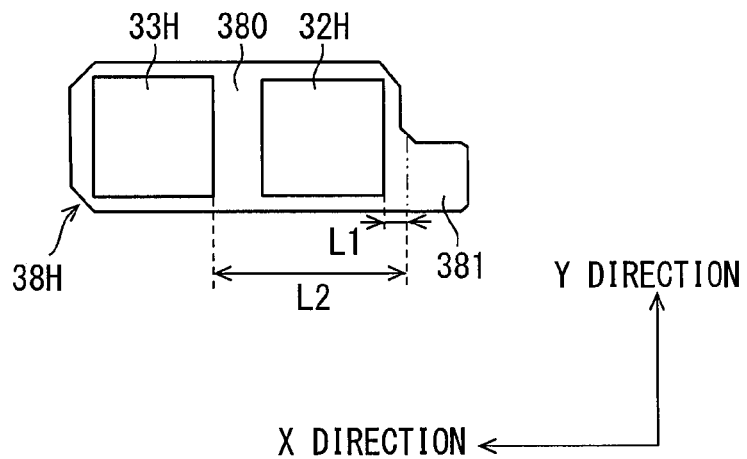
FIG. 8 is a diagram showing a plan view for explaining a positional relationship between a second metal member and a semiconductor chip according to the first embodiment.

In contrast, in the present embodiment, as shown in FIG. 8, in a plan view in the Z-direction, a shortest distance L1 between the semiconductor chip 32H on which the IGBT 15H is formed and the joint portion 381 which is the terminal portion is shorter than a shortest distance L2 between the semiconductor chip 33H on which the MOSFET 16H is formed and the joint portion 381. More specifically, as described above, the main body portion 380 of the second metal member 38H has a substantially rectangular shape as the planar view with the X-direction as the longitudinal direction. The joint portion 381 is connected to an end portion of the main body portion 380 of the second metal member 38L in the X-direction. The semiconductor chips 32H and 33H are disposed side by side in the X-direction so that the semiconductor chip 32H is placed adjacent to the joint portion 381.

Figure 9:
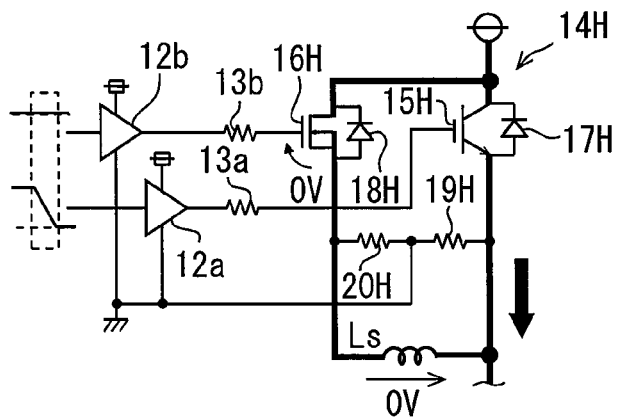
FIG. 9 is a diagram showing an equivalent circuit of the upper arm circuit.

FIG. 9 shows an equivalent circuit of the upper arm circuit 14H in consideration of the parasitic inductance Ls. Reference numeral 19H denotes a resistance of the wiring connecting the emitter electrode of the IGBT 15H and the common wiring described above. Reference numeral 20H denotes a resistor of the wiring connecting the source electrode of the MOSFET 16H and the common wiring described above. The connection point of the resistors 19H and 20H is connected to the ground through the common wiring. The drivers 12a and 12b generate a control signal based on the potential of the connection points of the resistors 19H and 20H, and output the control signal to the corresponding gate electrode.

With the above placement, according to the present embodiment, because the parasitic inductance on the emitter side of the IGBT 15H is sufficiently smaller than the parasitic inductance on the source side of the MOSFET 16H, the parasitic inductance on the emitter side is omitted and the parasitic inductance Ls on the source side is shown in FIG. 9 for the sake of convenience. Since the parasitic inductance on the emitter side is small, the induced voltage V developed when the IGBT 15H is turned off is also very small. Ideally, the induced voltage V can be considered to be approximately 0 V. For that reason, a voltage is not generated between the gate and the source of the MOSFET 216H, or even if the voltage is generated, the voltage is sufficiently lower in value than the gate withstand voltage.

Although the effect at the time of turning off the IGBT 15H has been described, the same effect can be obtained by the above placement because the MOSFET 16H is turned off even at the time of turning on the IGBT 15H. Also in the lower arm circuit 14L, in a plan view from the Z-direction, the shortest distance between the semiconductor chip 32L in which the IGBT 15L is formed and the joint portion 382 serving as the terminal portion is shorter than the shortest distance between the semiconductor chip 33L in which the MOSFET 16L is formed and the joint portion 382. Therefore, the same effects can be obtained for the lower arm circuit 14L.

As described above, according to the semiconductor device 30 of the present embodiment, and hence the power module 10, in the IGBT 15 and MOSFET 16 connected in parallel, the IGBT 15 is on at the time of switching the MOSFET 16, thereby restricting an excessive current from flowing into the MOSFET 16 and an increase in the temperature.

Further, the semiconductor chip 32 on which the IGBT 16 is formed is disposed closer to the joint portions 381 and 382 which are terminal portions in a plan view in the Z-direction than the semiconductor chip 33 on which the MOSFET 16 is formed. It is possible to reduce the parasitic inductances on the emitter-side of the IGBT 15. As such, it is possible to reduce the induced voltage generated at the time of switching of the IGBT 15 (in a transient state), and to restrict an excessive voltage from being applied between the gate and the source of the turned-off MOSFET 16.

In particular, according to the present embodiment, in the upper arm circuit 14H, the shortest distance L1 between the semiconductor chip 32H on which the IGBT 15H is formed and the joint portion 381 serving as the terminal portion is shorter than the shortest distance L2 between the semiconductor chip 33H on which the MOSFET 16H is formed and the joint portion 381. In the lower arm circuit 14L, the shortest distance between the semiconductor chip 32L on which the IGBT 15L is formed and the joint portion 382 serving as the terminal portion is shorter than the shortest distance between the semiconductor chip 33L on which the MOSFET 16L is formed and the joint portion 382. As described above, in the semiconductor device with the 2 in 1 packaged structure, both of the upper arm circuit 14H and the lower arm circuit 14L can restrict an excessive voltage from being applied between the gate and the source of the MOSFET 16 at the time of switching the IGBT 15, while reducing an increase in the temperature of the MOSFET 16.

Further, in the present embodiment, the joint portion 381 of the second metal member 38H and the joint portion 382 of the second metal member 38L are disposed side by side in the Y-direction. As a result, an increase in the body size of the semiconductor device 30 can be suppressed. The joint portion 382 is located between the main body portions 380 of the second metal members 38H and 38L, and the main terminal 383 (N terminal) is disposed adjacent to the main terminal 341 (P terminal) in the X-direction. With the placement of the main terminals 341 and 383 in parallel, the effect of canceling the magnetic flux can be enhanced, and the parasitic inductance of the main terminals 341 and 383 can be reduced.

Second Embodiment

The present embodiment can refer to the preceding embodiment. For that reason, a description of portions common to the power module 10 and the semiconductor device 30 described in the preceding embodiment will be omitted.

Figure 10:
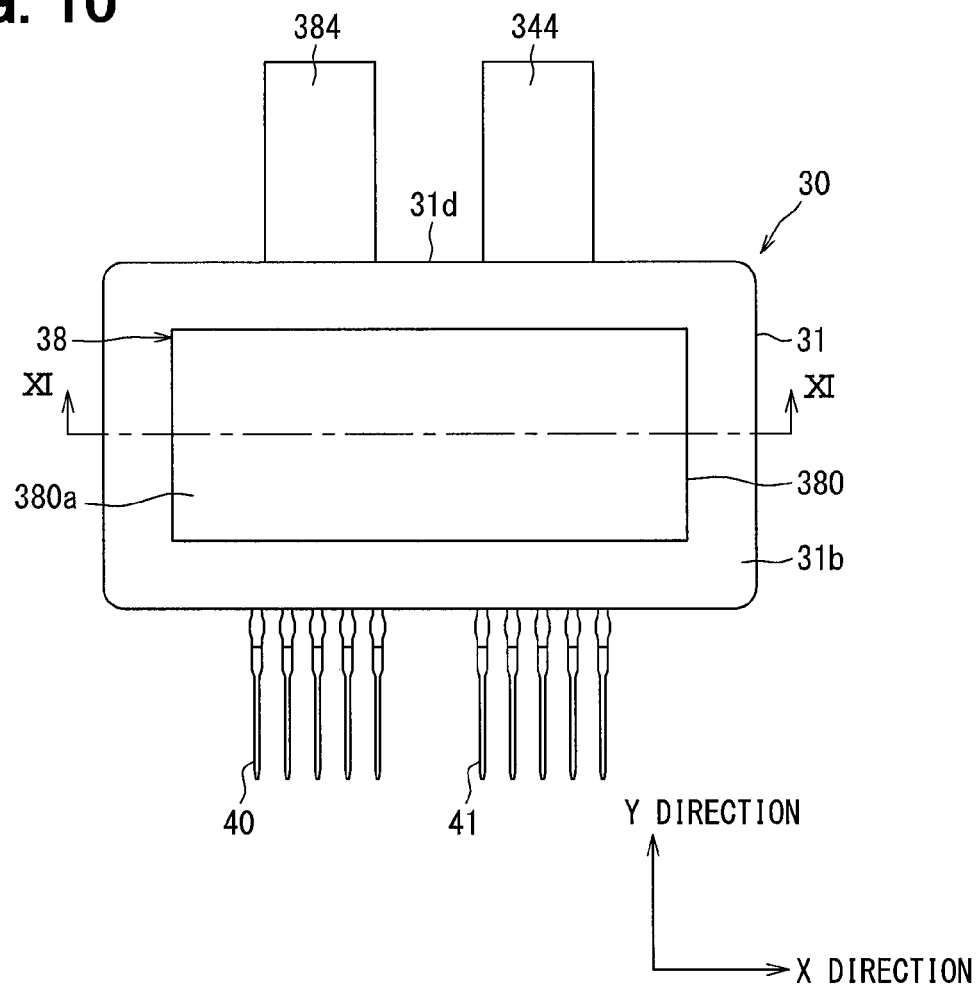
FIG. 10 is a diagram showing a plan view of a semiconductor device according to a second embodiment.
Figure 11:
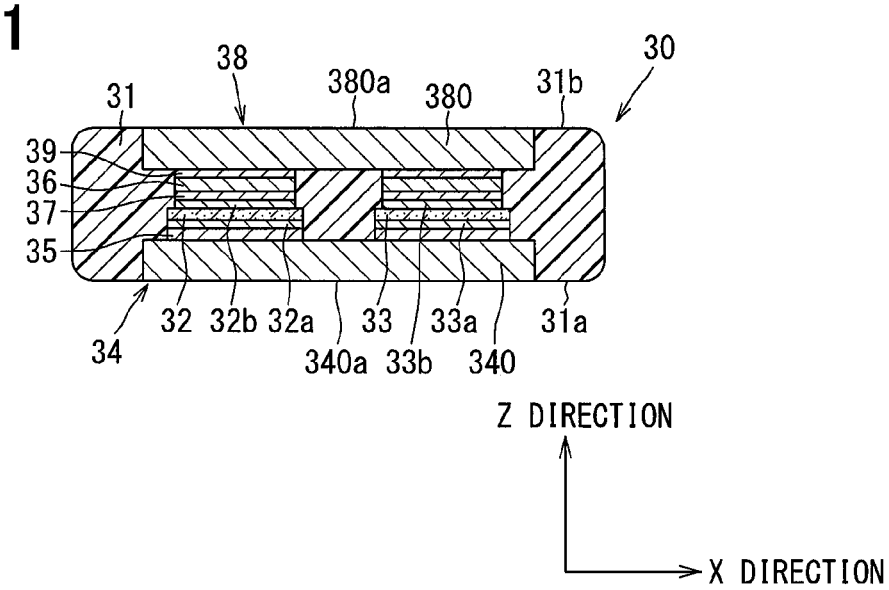
FIG. 11 is a diagram showing a cross-sectional view taken along a line XI-XI of FIG. 10.
Figure 12:
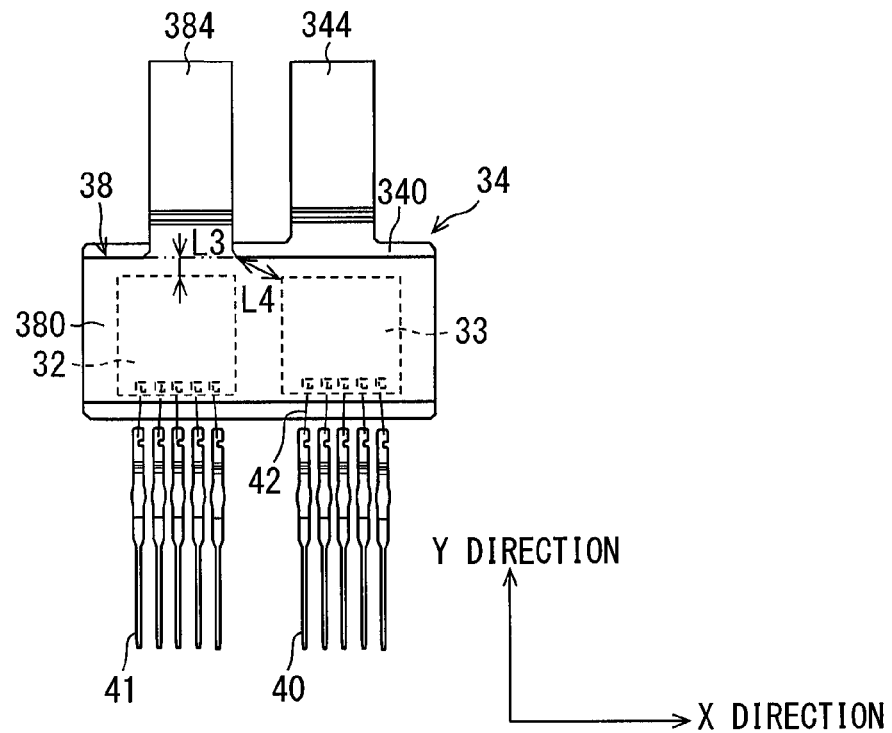
FIG. 12 is a diagram showing a plan view of the semiconductor device shown in FIG. 10 from which a sealing resin body is omitted.

As shown in FIGS. 10 to 12, a semiconductor device 30 according to the present embodiment has a 1 in 1 package structure. In other words, one of an upper arm circuit 14H and a lower arm circuit 14L is configured.

As shown in FIGS. 10 and 11, the semiconductor device 30 includes a sealing resin body 31, a semiconductor chip 32 on which an IGBT 15 is formed, a semiconductor chip 33 on which a MOSFET 16 is formed, a first metal member 34, a terminal 36, and a second metal member 38. The first metal member 34 has a main body portion 340 that is connected with a collector electrode 32a of the IGBT 15 and a drain electrode 33a of the MOSFET 16 through solders 35, and a main terminal 344 that is connected to the main body portion 340. The second metal member 38 has a main body portion 380 and a main terminal 384 as a terminal portion for allowing a current to flow into and out of the second metal member 38. The main body portion 380 is connected to an emitter electrode 32b of the IGBT 15 and a source electrode 33b of the MOSFET 16, solders 37, the terminals 36, and solders 39. As described above, the IGBT 15 and the MOSFET 16 are connected in parallel between the main terminals 344 and 384.

As shown in FIG. 12, the shortest distance L3 between the semiconductor chip 32 on which the IGBT 15 is formed and the main terminal 384 which is a terminal portion is shorter than the shortest distance L4 between the semiconductor chip 33 on which the MOSFET 16 is formed and the main terminal 384.

Figure 13:
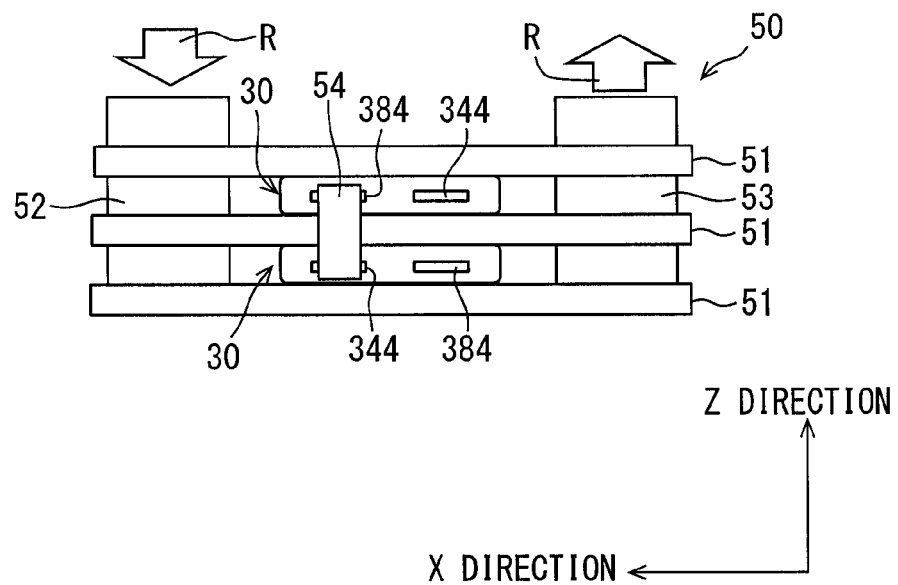
FIG. 13 is a diagram showing a semiconductor module.

FIG. 13 shows an example of a connection structure of two semiconductor devices 30 configuring the upper and lower arm circuit 14. A semiconductor module 50 shown in FIG. 13 includes two semiconductor devices 30 and a plurality of coolers 51 alternately stacked with the semiconductor devices 30 so as to cool the semiconductor devices 30 from both sides. The semiconductor devices 30 are sandwiched between the coolers 51 in the Z-direction. In FIG. 13, an arrow R indicates an inflow and outflow of the refrigerant.

The coolers 51 allow a refrigerant to flow inside, are disposed on both sides of the semiconductor devices 30, and cool the semiconductor devices 30 from both sides. The coolers 51 are formed in a tubular shape (tube shape) so as to have a passage through which the refrigerant flows. In the Z-direction, a predetermined distance is provided between the adjacent coolers 51 so that the semiconductor devices 30 and the coolers 51 are alternately stacked on each other.

The adjacent coolers 51 are connected to each other at one end side in the X-direction by an upstream side coupling portion 52. The upstream side coupling portion 52 functions to distribute the supplied refrigerant to the respective coolers 51. On the other hand, on the other end side in the X-direction, the adjacent coolers 51 are coupled to each other by a downstream side coupling portion 53. The downstream side coupling portion 53 functions to join the refrigerants distributed to the respective coolers 51 together.

The two semiconductor devices 30 are disposed so that the main terminals 344 and 384 are led out to the same side in the Y-direction. In addition, the main terminal 384 of one semiconductor device 30 (hereinafter, referred to as a first semiconductor device 30) and the main terminal 344 of the other semiconductor device 30 (hereinafter, referred to as a second semiconductor device 30) are disposed so as to overlap with each other in a projection view from the Z-direction. The main terminal 384 of the first semiconductor device 30 and the main terminal 344 of the second semiconductor device 30 are electrically connected to each other through a bus bar 54. The main terminal 344 of the first semiconductor device 30 is connected to a high potential power supply line through a bus bar (not shown). The main terminal 384 of the second semiconductor device 30 is connected to a low potential power supply line through a bus bar (not shown).

Also in the present embodiment, in the IGBT 15 and the MOSFET 16 connected in parallel to each other, the IGBT 15 and the MOSFET 16 are turned on in a stated order, and the MOSFET 16 and the IGBT 15 are turned off in a stated order. Therefore, an excessive current can be restricted from flowing through the MOSFET 16 to increase the temperature.

Further, the semiconductor chip 32 on which the IGBT 16 is formed is disposed closer to the main terminal 384 which is a terminal portion in a plan view from the Z-direction than the semiconductor chip 33 on which the MOSFET 16 is formed. Therefore, it is possible to reduce the parasitic inductances on the emitter-side of the IGBT 15. This makes it possible to reduce the induced voltage generated at the time of switching of the IGBT 15 (in a transient state), and to prevent an excessive voltage from being applied between the gate and the source of the turned-off MOSFET 16.

Although the present disclosure has been described in accordance with the embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, are within the scope and spirit of the present disclosure.

The example in which the IGBT 15 and the diode 17 are formed in the same semiconductor chip 32 has been illustrated hereinabove. However, the present disclosure is not limited to such as example. The IGBT 15 and the diode 17 may be formed in separate chips. Also, the example in which the MOSFET 16 and the diode 18 are formed in the same semiconductor chip 33 has been illustrated hereinabove. However, the present disclosure is not limited to such an example. The MOSFET 16 and the diode 18 may be formed in separate chips.

The example in which the semiconductor device 30 has the terminals 36 has been illustrated hereinabove. However, the semiconductor device 30 may not have terminals 36. In such a case, the second metal member 38 may be provided with a protrusion portion protruding toward the emitter electrode 32b and the source electrode 33b.

The example in which the heat radiation surfaces 340a and 380a are exposed from the sealing resin body 31 has been illustrated hereinabove. However, the present disclosure is also applicable to a configuration in which the heat radiation surfaces 340a and 380a are not exposed from the sealing resin body 31. The example in which the one surface 31a, the back surface 31b, and the heat radiation surfaces 340a and 380a of the sealing resin body 31 are provided by cutting surfaces has been illustrated hereinabove. However, the present disclosure is not limited to such an example. For example, the sealing resin body 31 may be molded such that the heat radiation surfaces 340a and 380a come in contact with a wall surface of a mold configuring a cavity.

The example has been described in which all of the semiconductor chips 32 and 33 are disposed so that the positional relationship between the one surface and the back surface of the semiconductor chips 32 and 33, that is, the positional relationship between the collector electrode 32a and the drain electrode 33a, and the positional relationship between the emitter electrode 32b and the source electrode 33b becomes the same between the upper arm circuit 14H and the lower arm circuit 14L. The present disclosure can also be applied to a configuration in which the positional relationship between the one surface and the back surface of the semiconductor chips 32 and 33 is reversed between the upper arm circuit 14H and the lower arm circuit 14L. In such a case, the second metal member 38H and the first metal member 34L are configured as one metal member. A portion between the main body portions 340 and 380 of one metal member serves as a joint portion as a terminal portion for allowing a current to flow into and out of the second metal member 38. In the above configuration, the shortest distance between the semiconductor chip 32H on which the IGBT 15H is formed and the joint portion is shorter than the shortest distance between the semiconductor chip 33H on which the MOSFET 16H is formed and the joint portion.

The microcomputer 11, which is a control unit, may be provided in another device (for example, an ECU). In other words, the power module 10 may be configured not to include the microcomputer 11 but to include only the driver 12 as the control unit.

The example in which the drivers 12 are individually provided for the IGBT 15 and the MOSFET 16 connected in parallel to each other has been illustrated. However, the drivers 12, that is, the control signals, can also be common. In this instance, when a threshold voltage of the MOSFET 16 is set to be larger than a threshold voltage of the IGBT 15, the turn-on is performed in the order of the IGBT 15 and the MOSFET 16, and the turn-off is performed in the order of the MOSFET 16 and the IGBT 15.

What is claimed is:
1. A semiconductor device comprising:
a first semiconductor chip that is formed with an IGBT, and has a collector electrode of the IGBT on a first surface and an emitter electrode of the IGBT on a second surface opposite to the first surface in a first direction which is a plate thickness direction;
a second semiconductor chip that is arranged next to the first semiconductor chip in a second direction perpendicular to the first direction, formed with a MOSFET, and has a drain electrode of the MOSFET on a first surface that is on a same side as the first surface of the first semiconductor chip in the first direction, and a source electrode of the MOSFET on a second surface that is on a same side as the second surface of the first semiconductor chip in the first direction;
a first metal member that is disposed adjacent to the first surfaces of the first and second semiconductor chips and electrically connected to both of the collector electrode and the drain electrode; and
a second metal member that is disposed adjacent to the second surfaces of the first and second semiconductor chips and electrically connected to both of the emitter electrode and the source electrode, wherein
the IGBT and the MOSFET are configured to be turned on in an order of the IGBT and then the MOSFET, and turned off in an order of the MOSFET and then the IGBT,
the second metal member includes a main body portion on which the first semiconductor chip and the second semiconductor chip are mounted, and a terminal portion that is connected to the main body portion and allows a current to flow into and out of the second metal member, and
in a plan view that is viewed in the first direction, a shortest distance between the terminal portion and the first semiconductor chip is shorter than a shortest distance between the terminal portion and the second semiconductor chip.

2. The semiconductor device according to claim 1, wherein
the semiconductor device configures an upper arm circuit and a lower arm circuit,
the first semiconductor chip includes an upper arm first semiconductor chip included in the upper arm circuit and a lower arm first semiconductor chip include in the lower arm circuit,
the second semiconductor chip includes an upper arm second semiconductor chip included in the upper arm circuit and a lower arm second semiconductor chip included in the lower arm circuit,
the upper arm first semiconductor chip and the lower arm first semiconductor chip are arranged such that the first surfaces having the collector electrodes are on the same side in the first direction,
the first metal member includes an upper arm first metal member included in the upper arm circuit and a lower arm first metal member included in the lower arm circuit,
the second metal member includes an upper arm second metal member included in the upper arm circuit and a lower arm second metal member included in the lower arm circuit,
the upper arm first metal member and the upper arm second metal member are disposed to interpose the upper arm first semiconductor chip and the upper arm second semiconductor chip between the upper arm first metal member and the upper arm second metal member,
the lower arm first metal member and the lower arm second metal member are disposed to interpose the lower arm first semiconductor chip and the lower arm second semiconductor chip the lower arm first metal member and the lower arm second metal member,
the terminal portion of the upper arm second metal member is configured as a first joint portion that electrically connects the main body portion of the upper arm second metal member to the lower arm first metal member,
in the plan view in the first direction, a shortest distance between the first joint portion and the upper arm first semiconductor chip is shorter than a shortest distance between the first joint portion and the upper arm second semiconductor chip, the terminal portion of the lower arm second metal member is configured as is a second joint portion that electrically connects the main body portion of the lower arm second metal member to a main terminal for external connection, and in the plan view in the first direction, a shortest distance between the second joint portion and the lower arm first semiconductor chip is shorter than a shortest distance between the second joint portion and the lower arm second semiconductor chip.

3. The semiconductor device according to claim 2, wherein the upper arm second metal member and the lower arm second metal member are arranged in the second direction, the first joint portion extends from an end portion of the main body portion of the upper arm second metal member toward the main body portion of the lower arm second metal member, the second joint portion extends from an end portion of the main body portion of the lower arm second metal member toward the main body portion of the upper arm second metal member, and the first joint portion and the second joint portion are arranged in a third direction orthogonal to both of the first direction and the second direction in the plan view in the first direction.

4. The semiconductor device according to claim 1, wherein the terminal portion is a main terminal for external connection.

5. The semiconductor device according to claim 1, wherein the second semiconductor chip is made of silicon carbide.

\* \* \* \* \*